United States Patent
Tsironis

(10) Patent No.: US 9,459,336 B1
(45) Date of Patent: Oct. 4, 2016

(54) HYBRID LOAD PULL SYSTEM AND METHOD

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 151 days.

(21) Appl. No.: 14/531,410

(22) Filed: Nov. 3, 2014

(51) Int. Cl.
| | | |
|---|---|---|
| G01R 31/36 | (2006.01) | |
| G01R 35/00 | (2006.01) | |
| G01R 21/133 | (2006.01) | |
| G01R 27/28 | (2006.01) | |
| G01R 27/06 | (2006.01) | |

(52) U.S. Cl.
CPC .......... *G01R 35/005* (2013.01); *G01R 21/133* (2013.01); *G01R 27/06* (2013.01); *G01R 27/28* (2013.01)

(58) Field of Classification Search
CPC .. G01R 35/005; G01R 21/133; G01R 27/28; G01R 27/06
See application file for complete search history.

(56) References Cited

U.S. PATENT DOCUMENTS

| | | |
|---|---|---|
| 6,509,743 B1 | 1/2003 | Ferrero |
| 6,639,393 B2 | 10/2003 | Tasker |
| 6,674,293 B1 | 1/2004 | Tsironis |
| 6,812,714 B2 | 11/2004 | Verspecht |
| 7,486,067 B2 | 2/2009 | Bossche |
| 8,497,689 B1 | 7/2013 | Tsironis |
| 8,786,293 B1 * | 7/2014 | Tsironis ................. G01R 27/06 324/613 |
| 8,841,921 B1 * | 9/2014 | Tsironis ............ G01R 31/2839 324/244 |
| 9,213,056 B1 * | 12/2015 | Tsironis ............ G01R 31/2621 |
| 9,331,670 B1 * | 5/2016 | Mahmoudi ............... H03J 1/00 |
| 2004/0207426 A1 * | 10/2004 | Tsironis ................. G01R 27/32 324/762.09 |
| 2013/0321092 A1 * | 12/2013 | Simpson ............... H03H 11/30 333/17.3 |
| 2014/0167793 A1 * | 6/2014 | Vanden Bossche ... G01R 31/00 324/750.01 |

* cited by examiner

Primary Examiner — Michael Zarroli

(57) ABSTRACT

Fast tuning and measuring algorithms in open loop active load pull systems have been developed to accommodate high speed production testing of many chips of the same kind on wafer; they are based on re-setting the (pre-calibrated) amplitude and phase of the injected power into the device output port. Because of the dispersion of the chip characteristics this often leads to non-physical load synthesis, i.e. $|\Gamma|>1$, which not only is unrealistic test condition, but also risks destroying the device under test, or reflection factors not high enough to reach the optimum Gamma of the DUT. A method is proposed to use a mechanical tuner in order to shift the active tuning inside meaningful areas; the tuner is also used to pre-match the device to the injection amplifier.

11 Claims, 16 Drawing Sheets

FIG. 15 (actual case from FIGS. 12 and 13)

HYBRID LOAD PULL SYSTEM AND METHOD

PRIORITY CLAIM

Not applicable

CROSS-REFERENCE TO RELATED ARTICLES

1. Load Pull: Wikipedia: http://en.wikipedia.org/wiki/Load_pull
2. "Computer Controlled Microwave Tuner—CCMT", Product Note 41, January 1998, Focus Microwaves.
3. "Overcoming Nonlinear Measurement Challenges", Application Note, Tektronix Corp, 2009.
4. U.S. Pat. No. 8,497,689, Christos Tsironis: Method for reducing power requirements in active load pull system.
5. Microwave power dividers and combiners; Wikipedia: http://en.wikipedia.org/wiki/Power_dividers_and_directional_couplers
6. U.S. Pat. No. 6,509,743, Andrea Ferrero: Active load or source impedance synthesis apparatus for measurement test set of microwave components and systems.
7. Network Analyzer: http://www.keysight.com/en/pd-867173-pn-N5242A/pna-x-microwave-network-analyzer?nid=-536902643.426031.00&cc=CA&lc=eng
8. Network Analyzer: http://www.rohde-schwarz.com/en/product/zva-productstartpage_63493-9660.html
9. U.S. Pat. No. 7,486,067, Marc Vanden Bossche: Real-time device characterization and analysis.
10. U.S. Pat. No. 6,639,393, Paul Juan Tasker: Methods and apparatus for time-domain measurement with a high frequency circuit analyzer.
11. U.S. Pat. No. 6,812,714, Jan Verspecht: Apparatus for collecting signal measurement data at signal ports of an RF and microwave device-under-test, under different impedance load conditions.
12. "MPT, a universal Multi-Purpose Tuner", product note 79, Focus Microwaves Inc., October 2004.
13. U.S. Pat. No. 6,674,293, Christos Tsironis: Adaptable pre-matched tuner system and method.

BACKGROUND OF THE INVENTION

This invention relates to testing and characterization of microwave high power transistors and amplifier chips (device under test, DUT); the test system disclosed here allows for high volume, high speed production testing chips on wafer through acquisition and processing of its RF characteristics, typically gain, output power, efficiency, intermodulation etc, under precise source and load impedance at the fundamental and harmonic frequencies (see ref. 1) corresponding to meaningful reflection factors $|\Gamma| \le 1$.

DESCRIPTION OF PRIOR ART

Traditional passive load pull systems (FIG. 1) comprise a signal source (1), which typically also includes a driver amplifier, an input impedance tuner (2) a DUT (Device Under Test) in a test fixture (3), an output impedance tuner (4) and a microwave power sensor (5). The injected power is measured through a coupler (see ref. 5) at a coupled port (6) at the input and the output power at the power meter (sensor) (5). Additional components, such as bias tees, attenuators, filters and couplers, as well as instruments such as power supplies and spectrum analyzers are also used but employ the same basic concept. The DUT's characteristics are measured as a function of source and load impedances generated by the tuners (2) and (4) at the operating (fundamental, Fo) and a number of harmonic frequencies (2Fo, 3Fo . . . ). The total is controlled by a system computer (11), which controls the tuners (2, 4) using digital cables (7, 8) and communicates (9, 12) with the instruments (5) for configuring, triggering and data acquisition (see ref. 1).

The reflection factors (20) created by the impedance tuners cover, typically, the largest part of the reflection factor plan (Smith chart), (21), FIG. 2; appropriate tuning and interpolation algorithms (see ref. 2) allow synthesizing almost every impedance within the effective tuning range (32) at the DUT port (FIG. 3); the effective tuning range at the DUT ports is reduced, compared with the "tuning range at tuner port" (33) because of the insertion loss between DUT and tuner (segments (10) and (12) in FIG. 1); therefore the actual tuning capacity of such a "passive" tuner system is shown in FIG. 3 as "tuning range at DUT port" (32). However, many power transistors (DUT) need to be matched at impedances (reflection factors) shown as dots (30) or (31).

The equivocal relationship between impedance Z, characteristic impedance Zo and Reflection Factor $\Gamma$ is: $\Gamma=(Z-Zo)/(Z+Zo)$; whereby Zo=50Ω, typically.

In the first case a minimization of the test fixture and interconnection loss (10, 12) might allow the tuner to reach this point (30). But in many other cases, like in the case of dot (31), this is simply impossible using a passive system as shown in FIG. 1. In this case an "active" solution is necessary. This is shown in FIG. 4; in this case, on top of the input signal (41) an additional signal (42), coherent with the input signal transmitted through the DUT to its output port (Pdut), is injected (Pinj) into the DUT output port and its phase and amplitude are adjusted in order to be properly superimposed to the signal Pref1 which is reflected by the passive tuner (47) and generate an enhanced virtual load, which corresponds to a reflection factor larger than the reflection factor generated by the power (Pref1) reflected at passive tuner alone (see ref. 4, 5). These configurations are called "open-loop", because they use two independent signal sources, one at the input and one at the output.

Hitherto open-loop active injection load pull systems (see ref. 6) employ a harmonic receiver (network analyzer, VNA), (40) which has at least two coherent (or synchronized) internal signal sources (41) and (42), which generate a signal at the operation frequency (Fo) also called "fundamental" frequency of which the relative amplitude and phase can be controlled and adjusted by the operator using appropriate commands. Their relative phase and amplitude remain constant during a power reading at the receiver detectors D1 and D2 (see ref. 7, 8). Some of those harmonic receivers/analyzers have more than two internal signal sources which can be adjusted to generate also harmonic coherent signals (see ref. 7, 8). The main signal (41) is injected into the input port of the DUT (43) via a signal boosting amplifier (44) and a electromechanical slide screw impedance tuner (45) and traverses a low loss directional coupler (46); the coupled ports of the coupler are connected to a reference (R1) and a measurement (D1) detectors of the VNA and allow to measure the travelling waves a1 and b1 and thus the injected power into the DUT and its internal input impedance. The injected power at the DUT input port is defined as $Pin=|a1|^2$ (eq. 1) and the input impedance (reflection factor $\Gamma dut$) as: $\Gamma dut=b1/a1$ (eq. 2). The power delivered from the output of the DUT to the load is defined as $Pdut=|b2|^2$ (eq. 3) and the total reflection factor seen by the DUT at its output port is $\Gamma load=a2/b2$ (eq. 4). In fact the total power injected into the output port of the DUT from the load is: Ptotal=Pref1+Pinj (eq. 5), whereby Pref1 is the power reflected at the passive tuner (47) and Pinj is the power coming from the second source (42) after being amplified by the amplifier (48). The output of the amplifier (48) is protected using a circulator (49) which has its third port terminated (401), operating thus as an isolator. Since Pinj can be adjusted in amplitude and phase a condition can be reached, whereby the reflected power Ptotal is equal to or higher than the power generated by the DUT, thus resulting in a total reflection factor Gamma (Γ) which can reach 1 (|Γtotal|≤1) or be even higher than 1 (|Γtotal|>1) (eq. 6); this is the purpose of the active injection tuning.

The advantage of the hybrid (passive & active) system is that, through the transformation of the 50Ω load impedance (48) towards the low DUT output impedance through the output tuner (47), the requirement for injected power (Pinj) at the fundamental frequency Fo to reach |Γ|=1 is reduced by a factor of 10 to 20, compared with the case where tuner (47) is not used, and, if the output tuner (47) is a harmonic tuner (see ref. 12), then independent passive harmonic tuning can be added to the fundamental combined (passive & active) tuning. However, since the load reflection factor depends on the power generated by the DUT, the system cannot be fully calibrated previously "off-line" and the calibration data simply retrieved from file and used. The system must be "on-line": it requires iterative real-time synthesizing each impedance through "reading" and "correcting" the power waves b2 and a2 at each movement of the tuner and each change of the amplitude or phase of the injected power. The reason for this difficulty lies in the fact that all power waves change, when the injected power changes, because the reaction of the device to the changing load is part of the synthesized impedance: Pdut is generated by the DUT as a reaction of the load impedance presented to it. FIG. 5 shows schematically a possible iterative tuning process. In order to reach high tuning speed, beyond the tuning speed of the electronic injection tuning, a pre-calibration is required. But, since the total reflection depends on the DUT, it is possible that the same injected signal generates reflection factor |Γ|>1, which may destroy the DUT. This invention discloses a method allowing limiting the virtual load gamma ($\Gamma_{Load}$) to values below 1, thus avoiding this risk, without reducing the test speed significantly.

BRIEF DESCRIPTION OF THE DRAWINGS

The invention will be better understood through the Figures included as follows.

DETAILED DESCRIPTION OF THE INVENTION

The test setup discussed here is wafer based: i.e. the DUT are chip transistors or monolithic integrated circuit (MMIC) amplifiers manufactured on a semiconductor wafer and shall be individually load-pull tested in-situ, i.e. before they are sectioned, separated and individually packaged. The chip-devices are designed and supposed to be identical, which in praxis means that they largely have very similar or identical DC and RF behavior. Therefore the method employs testing all chips for, nominally, the same set of load and source impedances. We are using the expression "nominally" since, as already discussed; the actual $\Gamma_{Load}$ depends also on the power delivered by the DUT: that is, even if the injected power Pinj is the same, $\Gamma_{Load}$ may be slightly different each time the DUT changes. This is though irrelevant, because the actual $\Gamma_{Load}$=a2/b2 is measured in real time (see ref. 9, 10). The devices are mounted on fully automatic wafer probe stations which are remotely controlled by a central computer; the devices are accessed through probing, i.e. the microwave probes, or rather the wafer, which is placed on the mobile chuck of the station, is positioned at precise coordinates and lifted, in such a way that the probes make reliable contact with each individual device one after the other very rapidly in a device hopping process, after which each device is automatically biased to given bias conditions using remotely controlled and sensed DC bias supplies. Once this is made the actual load pull test procedure for each individual chip starts.

Figure 4:
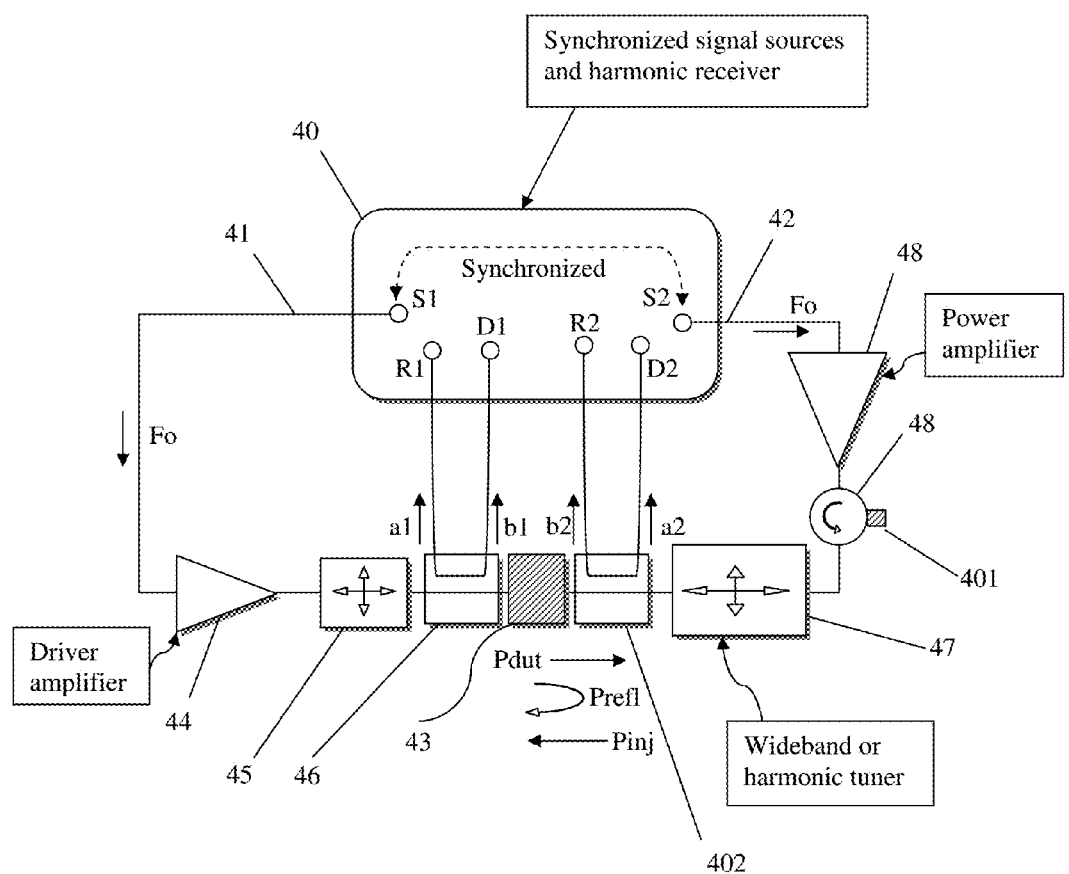
FIG. 4 depicts prior art, a schematic structure of a hybrid open loop active injection load pull setup and the associated nomenclature. This setup allows active injection at the fundamental frequency (Fo) and the possibility of independent passive harmonic tuning, when a harmonic tuner is used (47).

The active injection setup used is shown in FIG. 4 (see ref. 3, 11). It comprises the wideband harmonic receiver, having a signal output at the fundamental (operating) frequency Fo followed by a power amplifier (45) boosting the signal. The amplified signal enters into the input impedance tuner (45) and through the tuner to a low loss coupler (46) and then into the DUT's (43) input port. The signal exits the DUT at its output port; a small portion of the injected and extracted signal is sampled by the coupled branches of the couplers (46) and (402) and injected into the test ports of the receiver (40), whereby the R detectors serve as reference and the D detectors as measurement sensors of the associated injected and reflected traveling power waves a1, a2 and b1, b2, whereby a1 and a2 propagate towards the DUT and b1 and b2 propagate away from the DUT.

Figure 3:
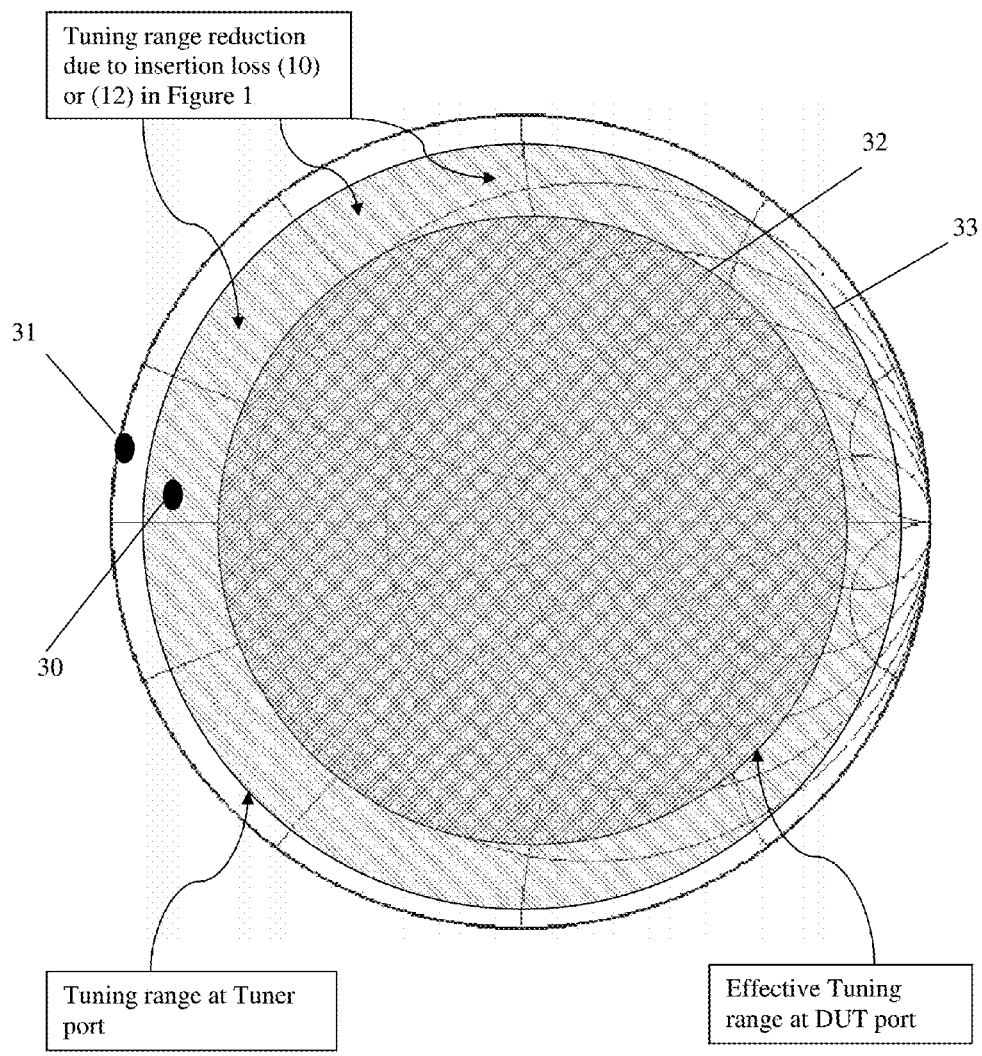
FIG. 3 depicts prior art, the reduction of tuning range (dynamics) of passive impedance tuners due to insertion loss between the tuner and the DUT.
Figure 5:
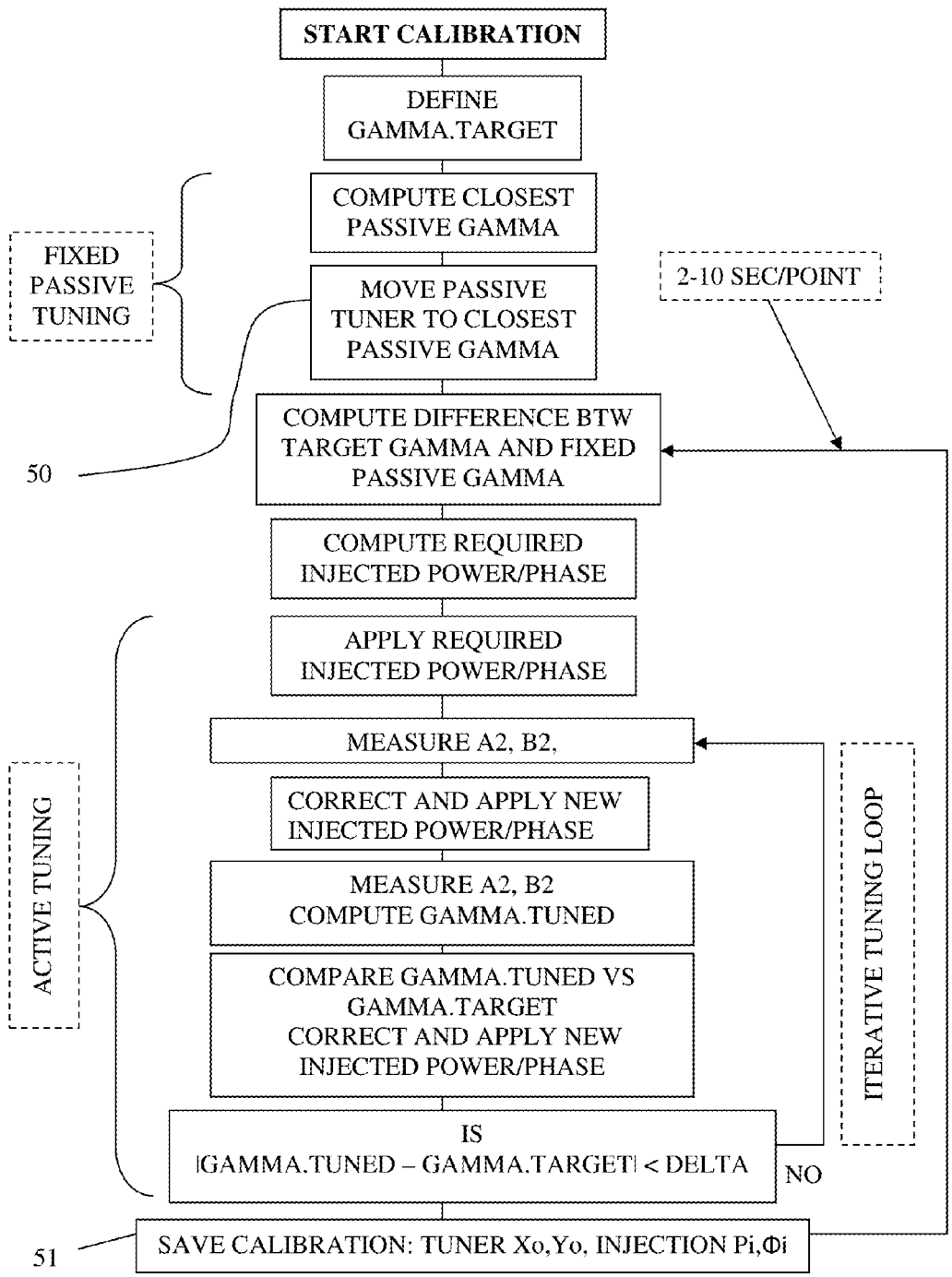
FIG. 5 depicts prior art: standard passive-active combined tuning algorithm of the hybrid active injection system implemented in the test setup of FIG. 4.

The test system can tune source and load impedances; i.e. it can generate any reflection factor required to test the DUT; the process for doing this is hereby called the tuning algorithm of which the flow-chart is shown in FIG. 5: After a target reflection factor Gamma is defined (either by the user manually, or in an automatic test procedure, where target Gamma is defined as part of a pattern in a loop), the processor calculates the closest passive tuning Gamma for minimum active injection power (Pinj in FIG. 4); this is typically a vector of the same or very similar angle as the target Gamma; the amplitude of the passive Gamma is computed as the best compromise between the proximity of passive Gamma to target Gamma and the tuner loss; there is always a tuner state at which the gain in Pinj from reducing the mismatch between passive Gamma and Gamma target is cancelled by the inherent tuner loss, which increases with increasing passive Gamma. The procedure further on presumes that the passive input tuner (45) is at a fixed position found to represent the optimum impedance matching of the DUT at the input, or as close to this condition as the tuning range of the tuner (45) allows, reduced by the insertion loss of the coupler (46) and the input section of the test fixture (43), see FIG. 3. Source tuning is considered optimum within the capacity of the test system and constant and is not discussed further. This invention concerns load tuning only. Hereby the use of a multi-harmonic tuner (see ref. 13) allows fixed independent tuning at the fundamental and harmonic frequencies, whereby at the harmonic frequencies there is no need to additional harmonic injection power.

Figure 6:
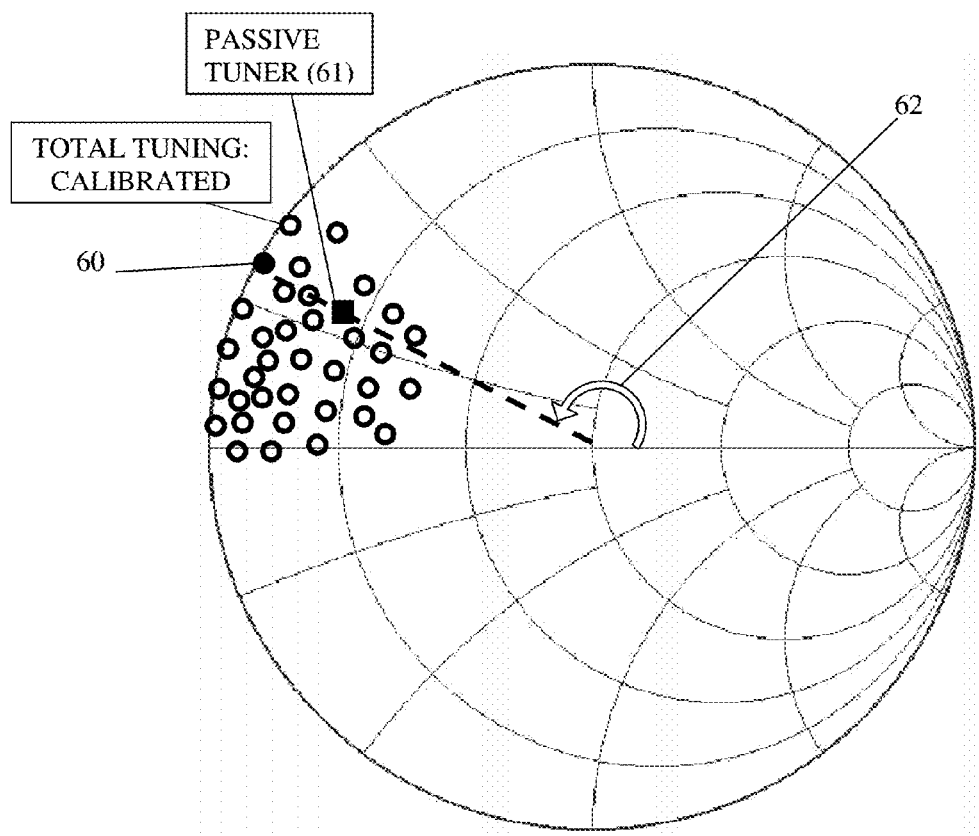
FIG. 6 depicts the calibrated points determined using a single passive tuning state and several active injection states following the algorithm of FIG. 7.

This (prior art) tuning process is shown in FIG. 6 for a typical example of a hybrid load pull pattern but is equivalent to any open loop active load pull system. The circles show the final tuning points, which can reach $|\Gamma|=1$. It shows also the associated passive tuning points (rectangles). Theoretically for each tuned point a different optimum passive point could be found and used. But this slows the process further, since the mechanical movement of the passive tuner costs time, beyond the fact that, even if two passive points of the Smith chart are very close, the passive tuner may have to go around a whole circle to reach the next point. This happens if the next point is beyond the calibration phase of the tuner, in which case the probe must move one half of a wavelength to reach the next point. Therefore in the present procedure the passive tuner is kept fixed, even if this might entail higher injected power, because of phase difference between the target Gamma ($\Gamma$) and the passive Gamma ($\Gamma$); this is shown in FIG. 6. In general the passive tuning point is chosen to have the same or similar angle (62) as the optimum load impedance (60).

Figure 8:
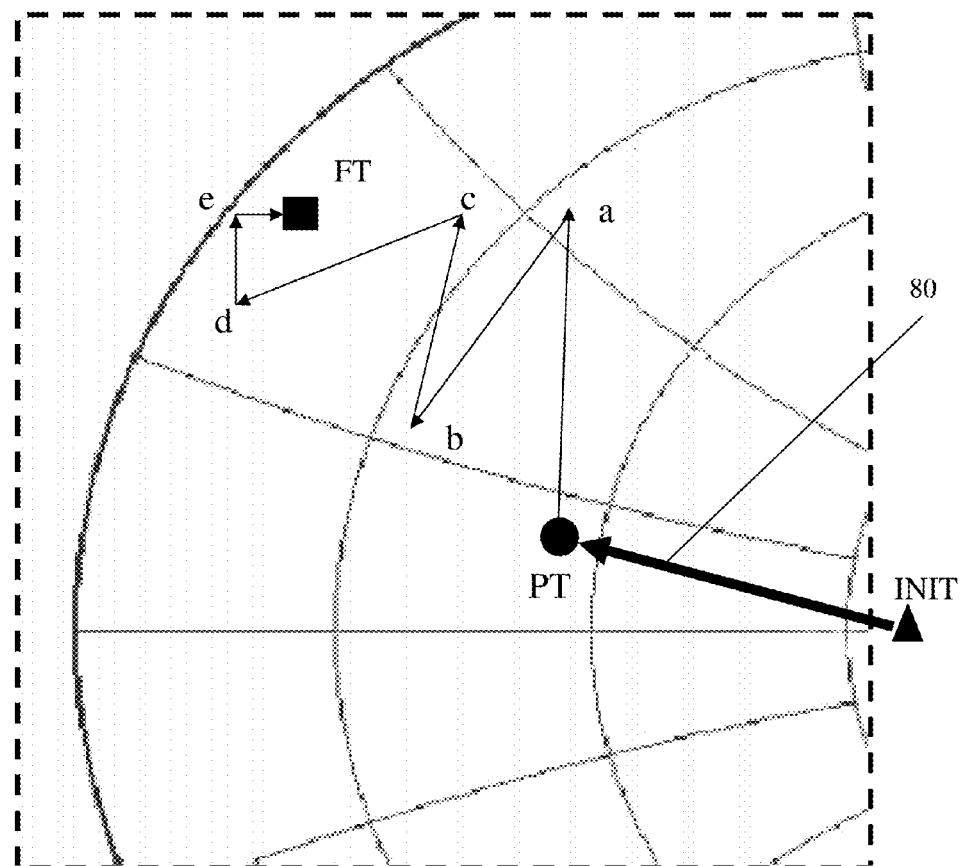
FIG. 8 depicts a typical trajectory of the gradient-based iterative active tuning algorithm in search of a final target point FT, starting from the initial position INIT, through the passive tuning state PT.

But even if mechanical (passive) tuning is avoided, the electronic search algorithm itself takes some time. The iterative process is shown in FIG. 8. Different than in passive tuning, where the main delay comes from moving the motors, because the iterations occur only in computer memory using pre-collected data, since the passive tuners are pre-calibrated and the data are simply loaded in memory and used. The electronic active tuning method is different because the power generated by the DUT affects the final result; this power (Pdut) depends on the load $\Gamma$load. Therefore after each tuning step the a2 and b2 must be measured (see FIG. 4) and appropriately corrected in an iterative gradient based process as shown in FIG. 8. The process of FIG. 8 works as follows:

i) Passive tuning is calculated for best compromise between injected power and tuner loss and the tuner is moved from point INIT (tuner probes withdrawn and output injection power Pinj turned off) to point PT (passive tuning);

ii) inject power with an initial random amplitude |Pinj| and phase $\Phi$inj;

iii) a2 and b2 are measured and Gamma is calculated: point (a): $\Gamma(a)$;

iv) using $\Phi$inj and |Pinj| and comparing with the amplitude and phase of FT (final target) a correction proportional to the phase difference ($\Phi a-\Phi FT$) and amplitude ($|FT|-|\Gamma(a)|$) is applied to the amplitude |Pinj| and $\Phi$inj;

v) a2 and b2 are measured again and $\Gamma(b)$ is calculated: point (b);

vi) The steps (iv-v) are repeated leading from point $\Gamma(b)$ to point $\Gamma(c)$;

vii) The process continues with points (d), (e) etc. until the final tuning reflection factor FT is reached within a pre-defined tuning vector tolerance Delta=$|\Gamma-FT|$; typical Delta values used are 0.001 to 0.01;

It is immediately clear that, even if the electronic tuning is fast, the repetition of steps (iv) to (vii) of applying corrections to $\Phi$inj and |Pinj| and each time measuring a2 and b2 take time, which must be reduced to a minimum to maximize testing speed.

Figure 1:
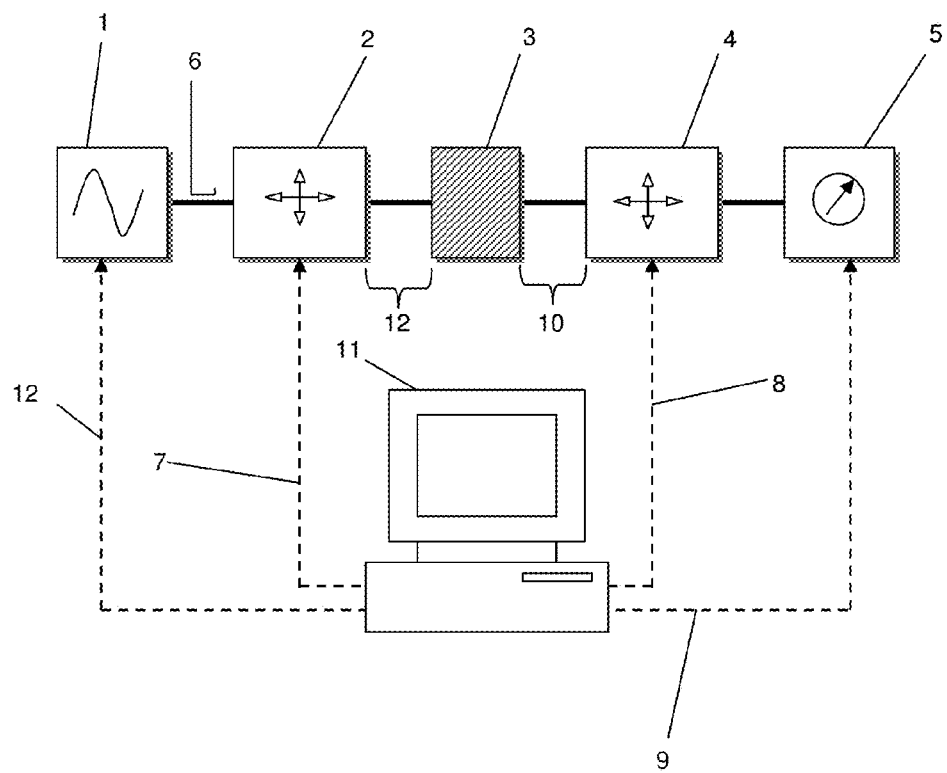
FIG. 1 depicts prior art, a typical automated load pull test setup using passive impedance tuners only.
Figure 2:
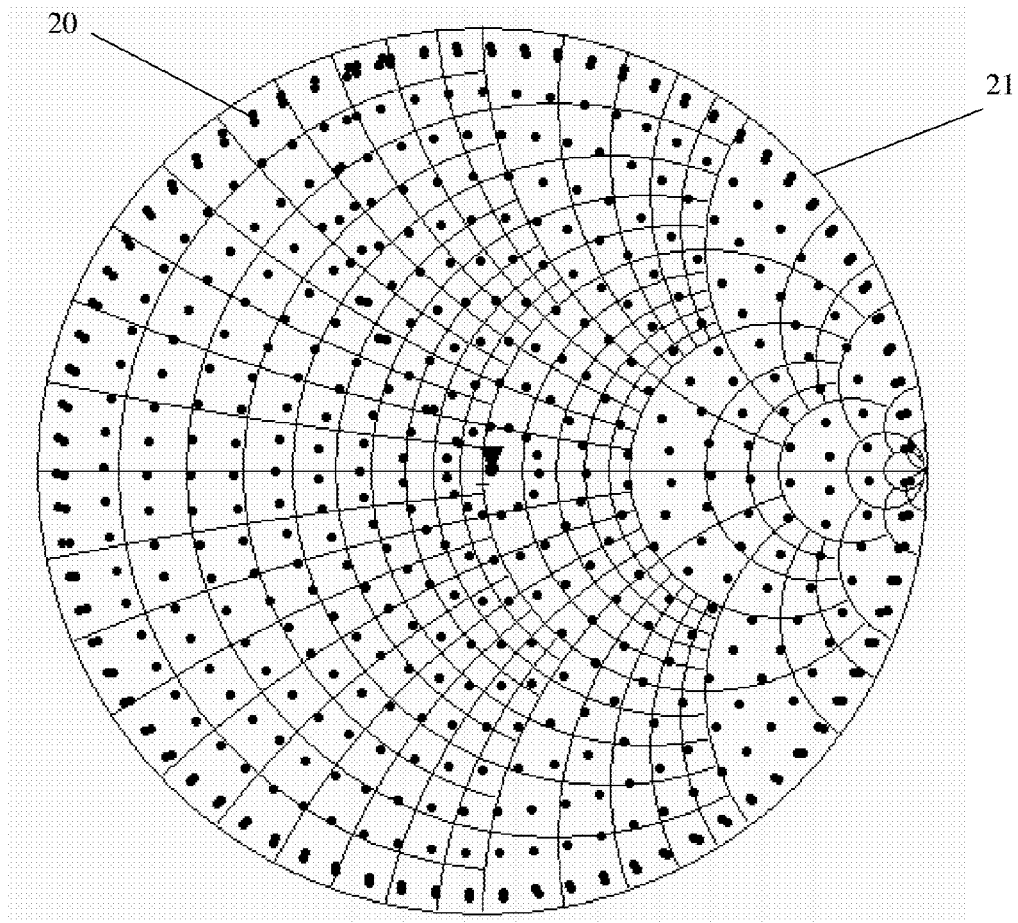
FIG. 2 depicts prior art, the distribution of calibration points of passive slide screw tuners on the reflection factor diagram (Smith chart).

In order to avoid these full scale tuning delays (steps iv to vii) a different approach is introduced. The routine is based on the assumption of repeated testing of similar or identical chip devices. In a production environment this is the case: hundreds or thousands of identical chips are manufactured on each wafer. Therefore it can be expected that their RF behavior will be identical or very similar and by consequence also the required test conditions. The proposed procedure assumes this. Each Second gained in testing of the individual chip means Hours in total testing of a wafer. In a first step therefore a typical chip (or a few typical chips) is tested in a calibration run using the algorithm of FIG. 5. If more than one chip is sample-tested an average is calculated. This calibration algorithm differs from previous testing algorithms in that it only uses a single passive tuning state (50). All subsequent tuning steps are electronic through amplitude and phase corrections of the injected signal (Pinj). This is a trade-off between optimum power-matching through the passive tuner and tuning speed. The procedure excludes slow mechanical tuning. The passive input and output tuners are fixed; the output tuner is set to a position (61) at approximately the same angle (62) as the optimum point of the DUT (60); the optimum impedance of the DUT is found through previous analysis of a general load pull run, in which an impedance spread over the whole Smith chart is applied, as shown in FIG. 2; the passive tuner then stays fixed. All other tuning in FIG. 6 is done electronically very fast. For every tuned point the amplitude |Pinj| and phase Φinj of the injected power vector Pinj=|Pinj|*exp (jΦinj) is saved in an active tuning calibration file (51).

Figure 7:
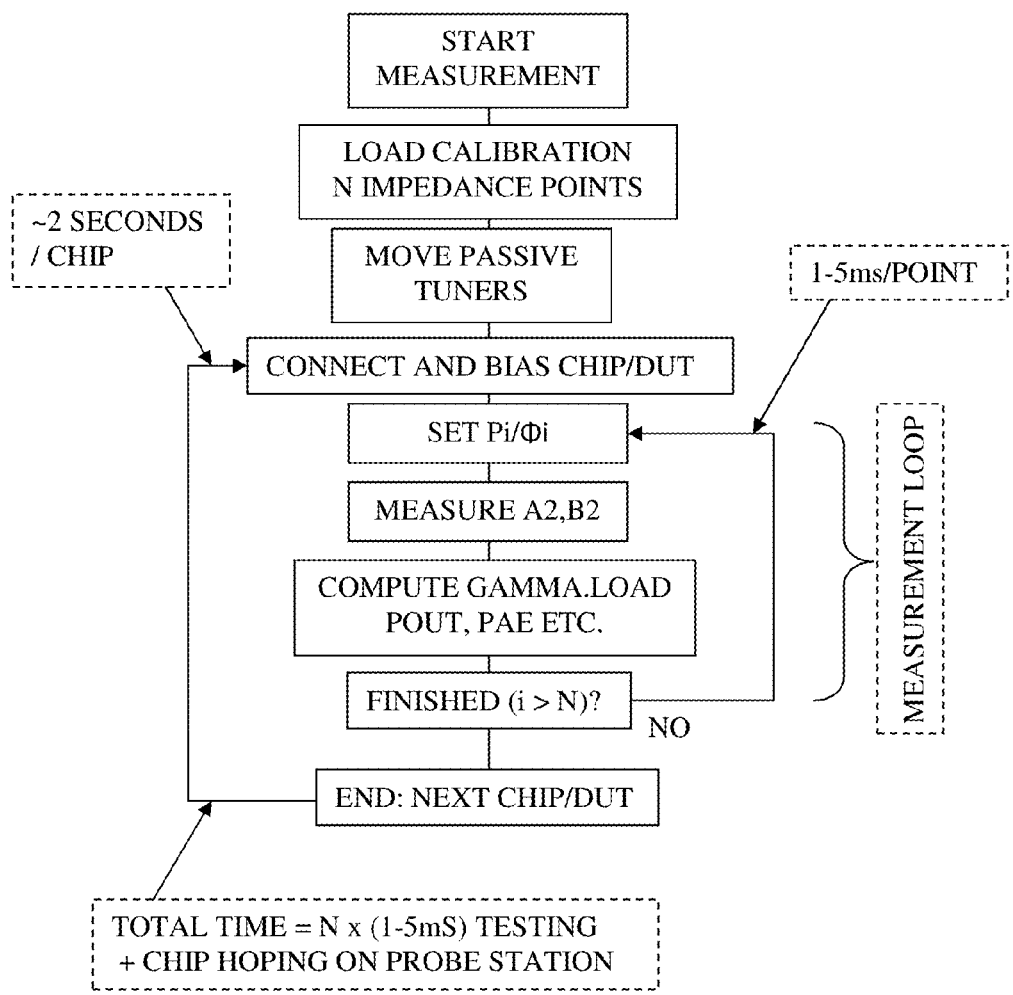
FIG. 7 depicts the accelerated tuning procedure using calibration data generated using the algorithm of FIG. 5.

The fast test procedure (FIG. 7) uses the calibration data in following steps:
a) Load the calibration data from file; the file contains the positions of the input and output tuners and a multitude of amplitude |Pinj| and phase Φinj of the injected power and, optionally, the bias conditions;
b) Set the passive input tuner to the point included in the calibration file; the tuner stays fixed;
c) Set the passive output tuner to the point included in the calibration file; the tuner stays fixed;
d) Connect the wafer-probes to the next chip and bias it;
e) Start the load pull operation:
  i. Set amplitude and phase of the injected power retrieved from the calibration data;
  ii. Measure a1, b1, a2, b2 and save;
  iii. Go to next point, step (i);
  iv. Terminate when all impedance points are tested;
f) Save data for the specific chip;
g) Turn off bias off the chip and go to next chip, step d).

Usual delays of the above operations are: a) 0.5 seconds per probe hoping from one chip to the other; b) biasing the chip: 0.5 seconds; c) load pulling 50 points (1.5 seconds). Total testing time around 2 seconds per chip compared to about 1 minute previously, or close to 30 times faster. For testing a complete wafer with 10,000 chips the new method needs approximately 5.5 hours. This is still lots of time but much faster than existing speeds of at least 100 to 150 hours per wafer.

Figure 9:
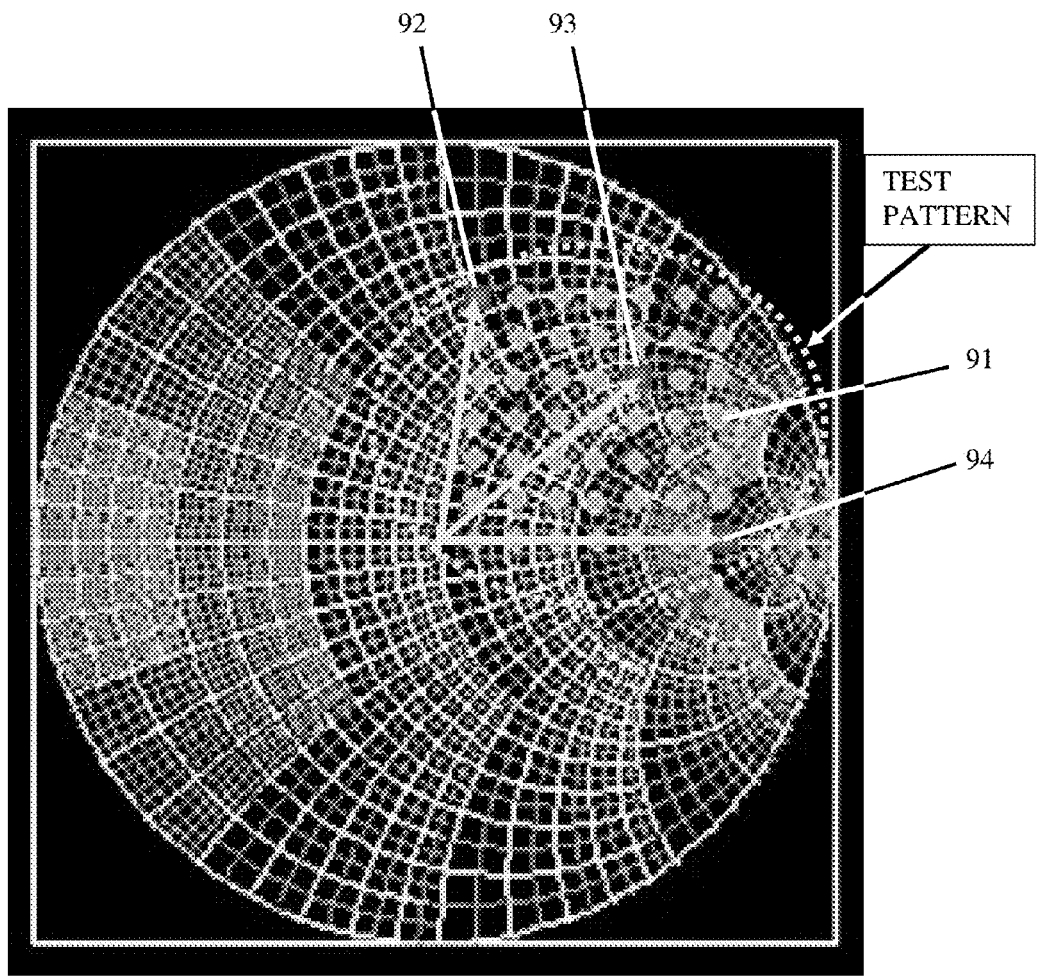
FIG. 9 depicts a pattern of reflection factors generated using a set of active tuning settings on a certain DUT #1.
Figure 10:
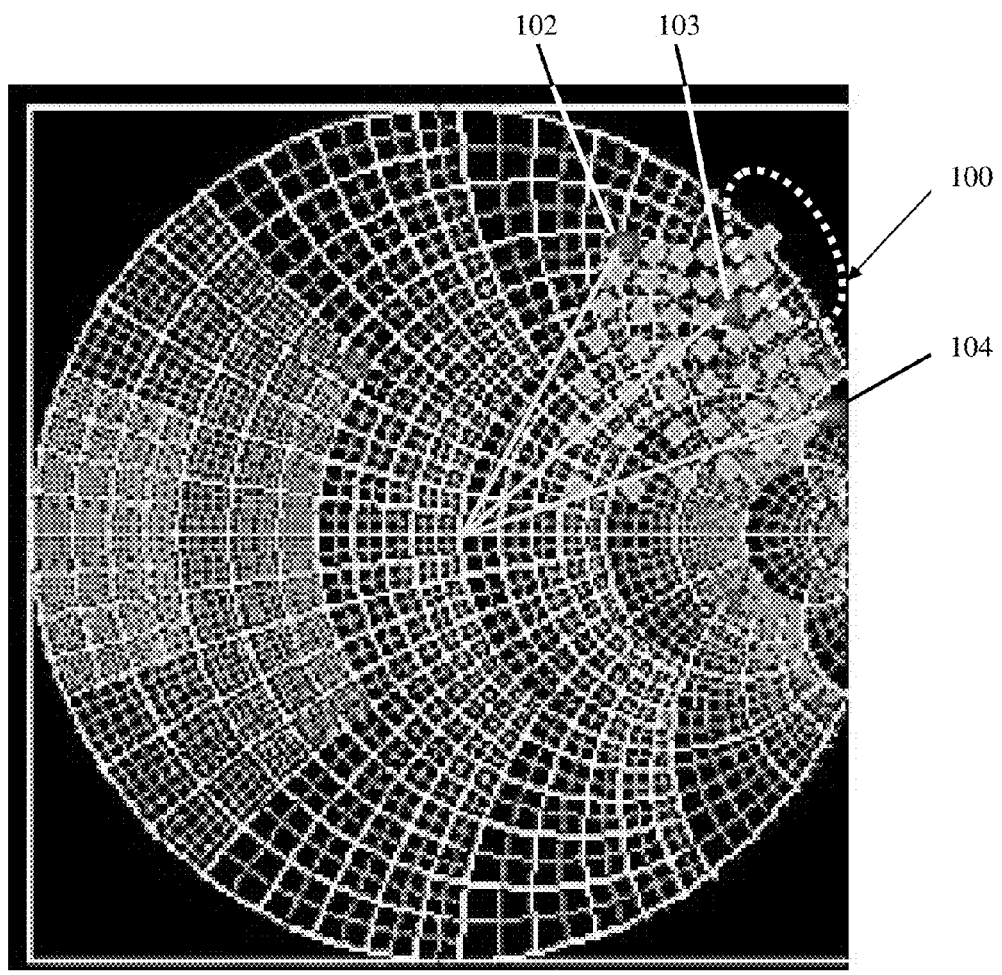
FIG. 10 depicts the pattern of reflection factors generated using the same set of active tuning settings as in FIG. 9 on a different DUT #2.

The achievable high tuning speed, as described hitherto, bears the disadvantage of presenting to the DUT load pull impedances, for the same injected feedback signal, different than the calibrated values. The reason is that they are synthesized for slightly different DUTs or DUTs operated under slightly different conditions. This can be seen when comparing FIGS. 9 and 10. Both patterns are generated using the exact same settings of the feedback injection source, amplitude and phase. In FIG. 9 the impedance (91) pattern is regular and corresponds to the calibrated data points. In FIG. 10, instead the pattern is skewed. The active injection settings (and thus $b_2$ (Fo)) is the same in both devices (FIGS. 9 and 10). The DUT response (a2), however, is different and therefore $\Gamma_{Load}$=b2/a2 is also different. As long as the differences are small this does not matter, because the actual RF data and impedances are measured at the same time and generate valid contour plots. If, however, as shown in FIG. 10, some points are excessive or even outside the Smith chart (100), which corresponds to negative real part ($R_L$<0) of the load impedance $Z_L=R_L+jX_L$, then the DUT may be destroyed. This must be avoided a) before the device is destroyed and b) without restarting the whole tuning sequence of FIG. 5 and sacrificing the testing speed unnecessarily. A solution to this problem is proposed here forth.

Figure 11:
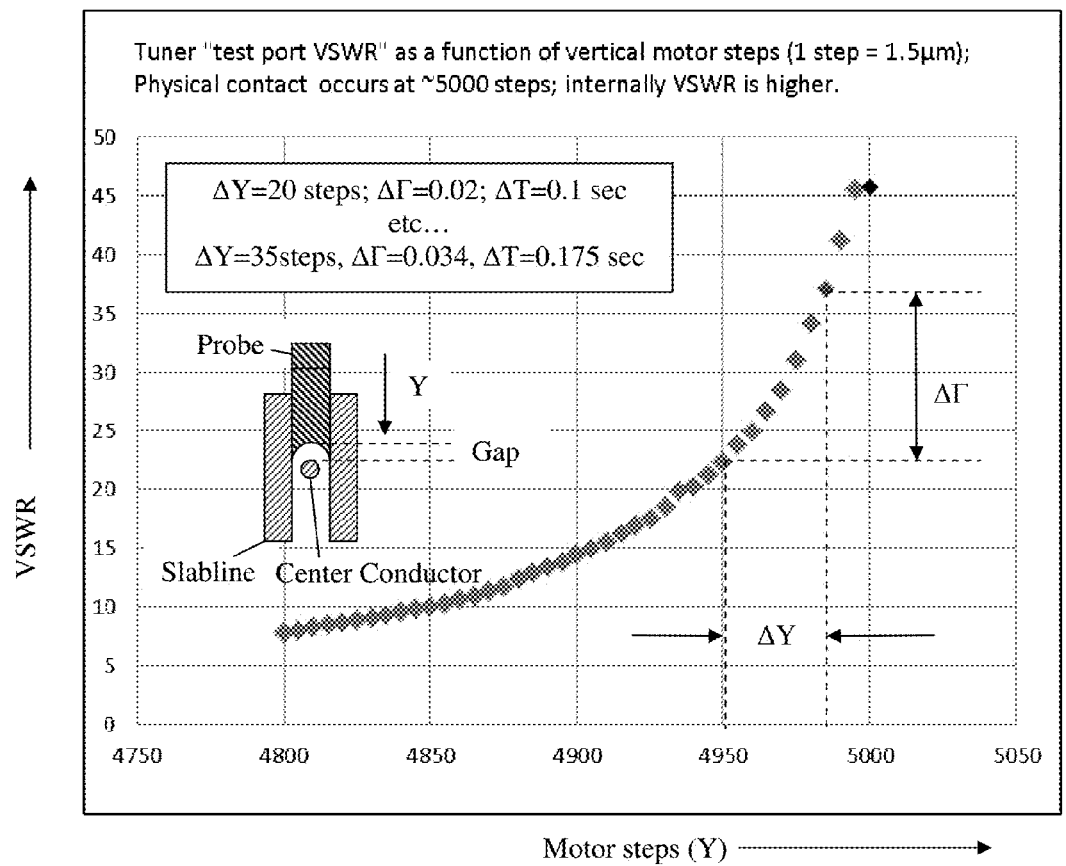
FIG. 11 depicts prior art, the reflection factor (expressed in VSWR=(1+|Γ|)/(1−|Γ|)) as a function of the vertical position of the tuner probe (defining the gap between probe and center conductor of the tuner slabline).
Figure 12:
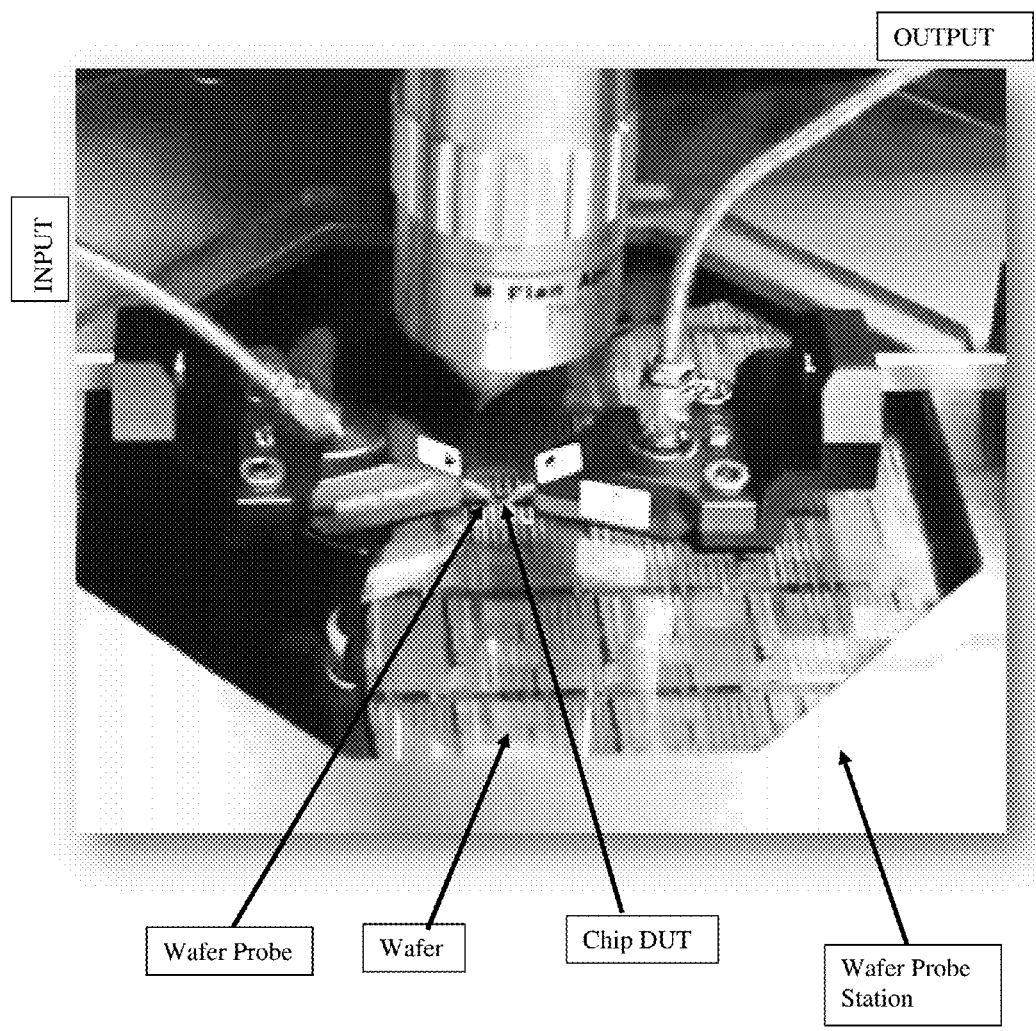
FIG. 12 depicts prior art, a view of a semiconductor wafer tested using wafer probes on a semi-automatic wafer probe station.
Figure 13:
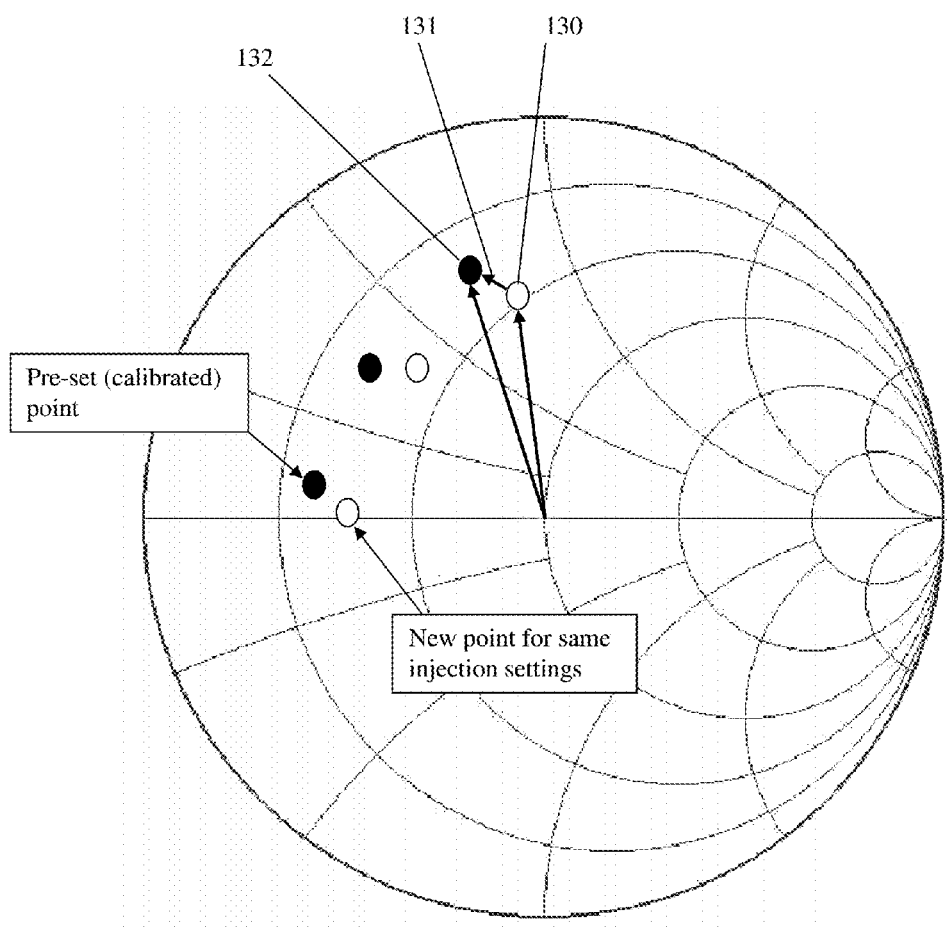
FIG. 13 depicts a situation, whereby the reflection factors generated by the preset settings of the feedback injection source (130) have lower amplitude than the calibrated values (132) and must be corrected by increasing the passive tuner reflection factor by the amount (131).
Figure 14:
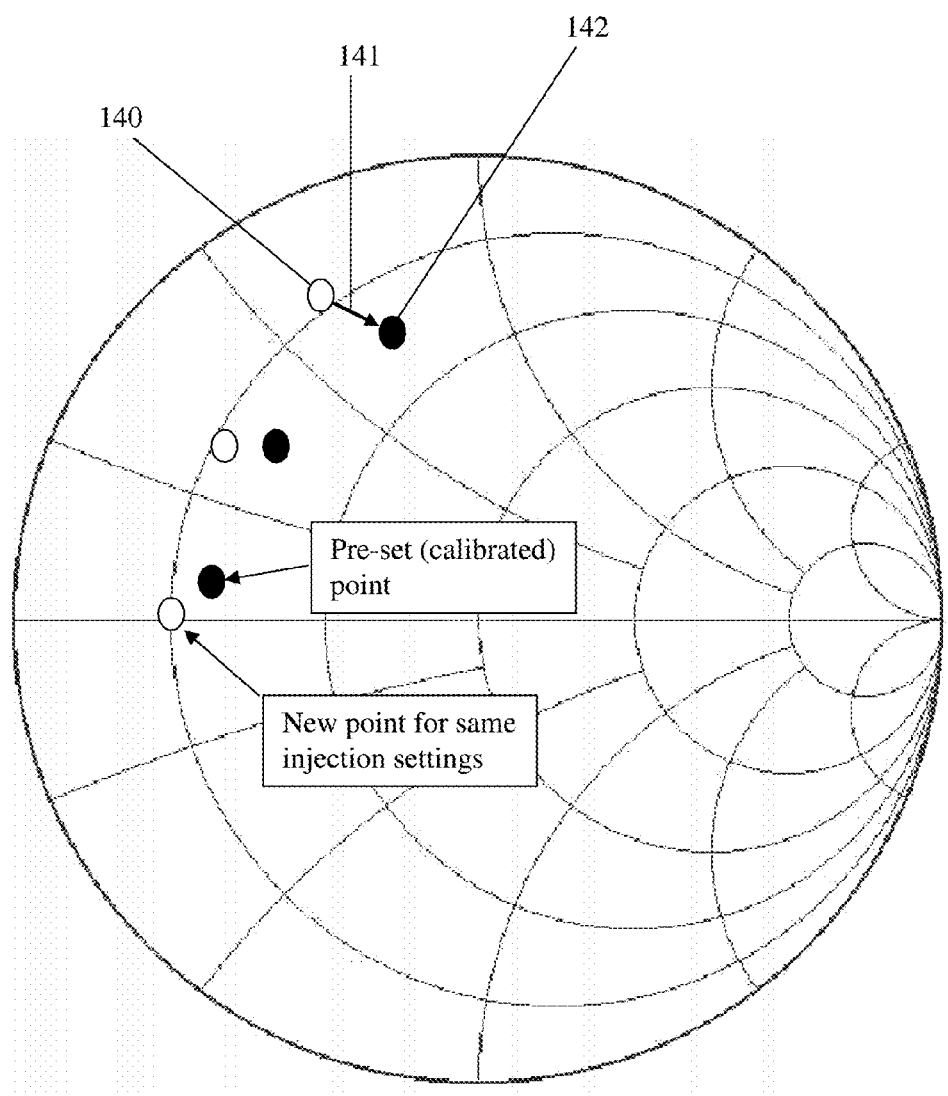
FIG. 14 depicts a situation, whereby the reflection factors generated by the preset settings of the feedback injection source (140) have higher amplitude than the calibrated values (142) and must be corrected by reducing the passive tuner reflection factor by the amount (141).

As can be seen in FIGS. 13 and 14 there can be only two principal cases, where the tuned impedances are significantly different than the previously calibrated points. In both Figures the calibrated points in the test pattern are shown as black dots. The actually measured points are circles. In the case of FIG. 13, i.e. when the new points (130) are closer to the center of the Smith chart than the calibrated points (132), action must be taken, by introducing a correction vector, to increase the reflection, since the new points might not include the optimum reflection factor of the DUT. The correction vector is shown as item (131). This increase can be made using higher passive tuning PT (80) in FIG. 8. As shown in FIG. 11 higher passive tuning vector means smaller gap between center conductor and tuning probe in the passive tuner. Because of the high tuning sensitivity related to the vertical position of the probe (FIG. 11) the correction needed can be implemented in a small fraction of a second (the vertical tuning speed in this area is typically $\Delta\Gamma/\Delta T \approx 0.2$/second. Changes of the amplitude of the passive reflection factor |Γ| by an amount of |ΔΓ|=0.05 require, therefore ΔT≈0.25 seconds. The appropriate Gamma correction does, thus, not increase the test time significantly, if the threshold criteria to launch the correction are chosen such as not to use the correction step too often. This, of course depends also on other factors, like the homogeneity of the technology able to produce identical chips. However the possible loss of speed is compensated by significant advantages such as avoiding destruction of the chips and better spread of the test impedances for fluctuating device properties. In addition, increased test time of the automatic test routine would be then an immediate and useful indicator about the quality and the yield of the wafer manufacturing technology.

The opposite of the events in FIG. 13 happens when the calibrated points (142) are lower in Gamma than the actual points (140). In that case the correction vector (141) points outwards and can be generated by increasing the passive tuner reflection factor; this is done by reducing the gap between the center conductor and the tuning probe (FIG. 11). The time calculations are similar to the ones for FIG. 13.

Figure 15:
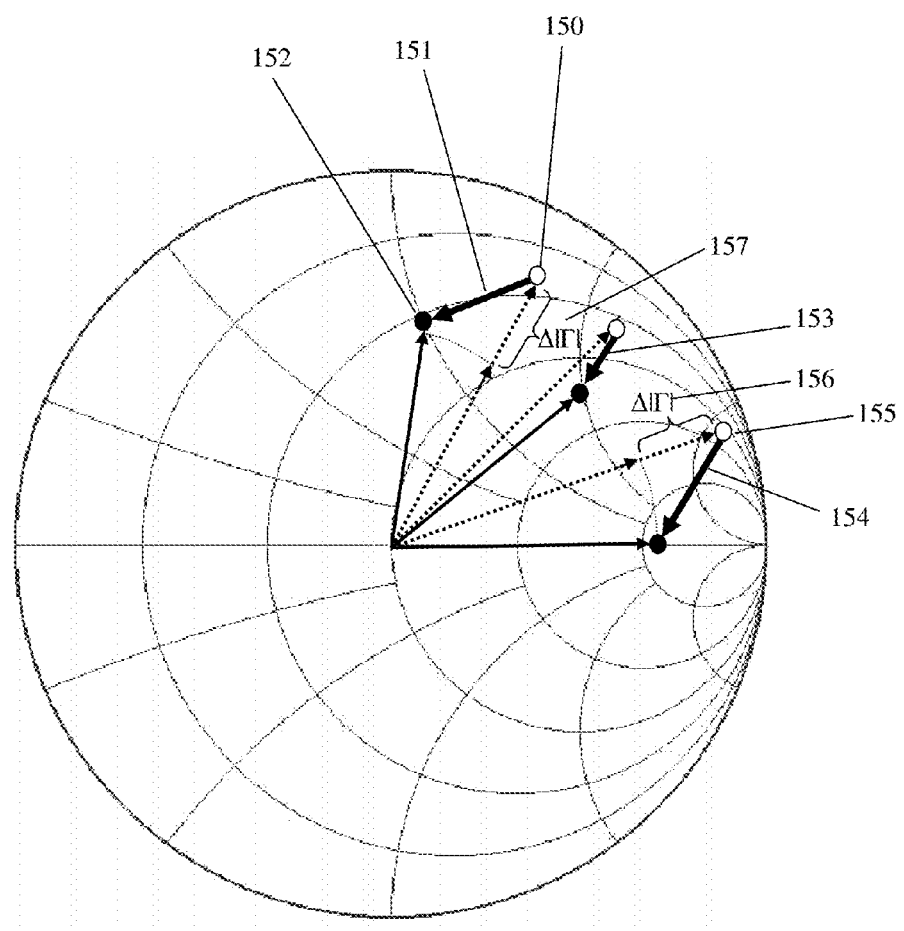
FIG. 15 depicts an overlapping of the data measured in FIGS. 9 and 10 to emphasize the effect of varying DUT characteristics on generated load pull reflection factors, created using the same settings of the passive tuner and the active injection.

We select three significant points in the test pattern of FIGS. 9: (92), (93) and (94). These points describe well the rectangular load pull impedance test pattern, measured on a reference device. After testing a new device (FIG. 10) we observe what happened to the above points: point (92) moved to (102), point (93) moved to (103) and point (94) moved to (104). The overlapping of these results is summarized in the single plot of FIG. 15: the point movement and associated correction vectors are shown (151), (153) and (154). It can be observed that the phases change as well, but not in the same direction. Delta vectors (151) and (154) have diverting phases whereas vector (153) has approximately 180° opposite phase than the original reflection factor. It is concluded that a relationship allowing calculating a corrective action based on phase shifting is not obvious. Remains the amplitude change. This is possible in view of the fact that the Delta vectors have similar size and their projection on the original vector is also similar (Δ|Γ|). The proposed algorithm is using the average Delta vector correction, calculated in the present case of three reference points as $\Delta|\Gamma|_{total} \approx 1/3 * \Sigma(\Delta\Gamma)$; this is used in order to drive the tuning probe of the passive tuner into a new vertical position calculated using the scaling plot of FIG. 11. VSWR in FIG. 11 follows roughly: VSWR≈8+exp(0.018*(Y−4800)); the principle of this relationship is generally valid, but shall be calculated automatically for each new passive tuner and each calibration frequency and shall be available in memory before starting the correction and measurement routines. From this relation it is easy to calculate the new VSWR and the number of vertical steps the tuning probe has to be lifted or inserted to reduce or increase the passive reflection factor by Δ|Γ|=Δ|(VSWR−1)/(VSWR+1)|.

Figure 16:
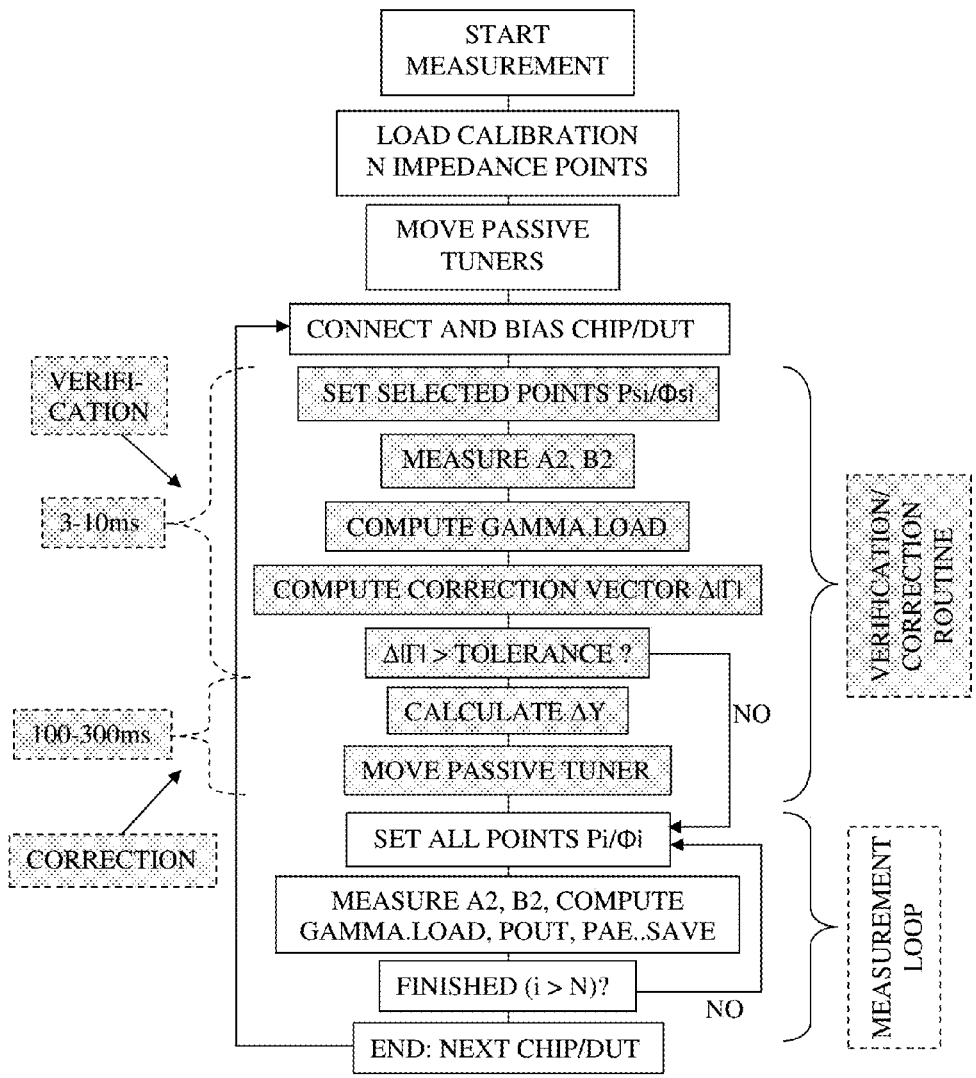
FIG. 16 depicts the flowchart of the extended test algorithm, which comprises the verification and, eventual, passive tuning correction step.

At the beginning of the testing a threshold tolerance shall be defined by the user, to decide when the correction is launched. This can be done in terms of ΔΓ values or in terms of % deviation from average. In both cases an experienced operator will choose not to overuse the routine, since this would slow down the testing speed without adding valuable information to the result. Typical tolerance of 5 to 10% would be acceptable. The extended measurement algorithm is shown in the, self-explanatory, flowchart of FIG. 16. The selected reference points (92), (93) and (94) are measured first and it is then decided if there must be a corrective action of the passive tuner, as indicated in the shadowed area of the flowchart. As can be seen from the estimates in FIG. 16, the verification/correction routine includes i) a 3-10 ms verification step delay at the beginning of testing a new chip and, if found necessary, ii) a 100-300 ms Gamma correction step.

The deviation of the next to be tested chip from the average calibrated one might also be detected by comparing the DC current flowing through the chip for the same Gate and Drain voltages applied. Though, in that case, the exact variation in Gamma is difficult to estimate and therefore the necessary correction in passive Gamma cumbersome to establish.

This invention discloses preferred embodiments of a new measurement method for high speed hybrid load pull systems, which allows production quantity load pull testing while controlling the maximum tuned reflection factor within physically meaningful and operationally safe limits. Obvious alternative embodiments are imaginable but shall not impede on the originality of the described preferred embodiments.

What I claim as my invention is:

1. A load pull test system comprising
   a) a test setup,
   b) a calibration algorithm,
   c) a reflection factor verification and correction routine and
   d) a measurement procedure,
   whereby
   a) said test setup comprises at least two synchronized signal sources, a primary source injecting power into the input of the DUT and a secondary source injecting power into the output of said DUT, at least one power amplifier, input and output low loss couplers, at least one pre-calibrated passive impedance tuner, harmonic receiver and control computer controlling the tuner(s) and signal sources;
   b) and whereby said calibration step comprises fixed passive tuning, using said tuner, and variable electronic tuning to a multitude of reflection factors, created using selected representative DUT samples, and saving reflection factors and associated passive and electronic tuning settings;
   said electronic tuning settings comprising amplitude and phase control of said secondary signal source;
   c) and whereby said reflection factor verification and correction routine precedes the measurement routine and comprises three steps:
      i) sampling reference reflection factors in the test pattern, seen by the DUT, for a selected amplitude and at least two phase setting of the signal injected into the output port of said DUT,
      ii) comparing reflection factor measured in step i) with corresponding values saved in calibration step b);
      iii) correcting, if necessary, the reflection factor of the passive tuner, to create total reflection factor measured in step i) to values within a given tolerance to corresponding calibration data of step b);
   d) and whereby said measurement step is a procedure comprising only electronic tuning and measuring and saving incident and reflected power waves and associated reflection factors.

2. A reflection factor verification routine as in claim 1, whereby said reference reflection factors comprise at least two values close to opposite corners of the said test pattern at approximately equal distance from the center of the Smith chart and at least one point close to the center of said test pattern.

3. A reflection factor correction routine as in claim 1, whereby the amplitude of the correction vector ΔΓ is approximately equal to the average difference between the calibrated and actual reflection factors at the reference points and the phase of said correction vector approximately the same to the phase of the original reflection factor generated by the passive tuner.

4. A reflection factor correction routine as in claim 1, whereby the reflection factor of said passive tuner is increased if all the reflection factors sampled in step (i) are lower than the corresponding calibrated values in step (b),
   and whereby said reflection factor of said passive tuner is reduced if any of the reflection factors, sampled in step (i), is higher than the corresponding calibrated value of step (b).

5. A reflection factor correction routine as in claim 3, whereby said reducing the passive reflection factor comprises increasing the gap between the tuner probe and the center conductor of said slabline,
   and whereby said increasing the passive reflection factor comprises reducing the gap between said probe and the center conductor of said slabline.

6. A measurement procedure as in claim 1, whereby said incident and reflected power waves into the output port of said DUT and associated reflection factors are measured and saved, and whereby said harmonic components of said power waves are measured at a fundamental frequency (Fo) and at least one harmonic frequency (2Fo, 3Fo . . . ),
   and whereby said harmonic components of said waves allow constructing real time waveforms of voltage and current applied to said DUT.

7. A measurement procedure as in claim 1, whereby said incident and reflected power waves into the input and output port of said DUT and associated reflection factors are measured and saved,
   and whereby said harmonic components of said power waves are measured at a fundamental frequency (Fo) and at least one harmonic frequency (2Fo, 3Fo . . . ),
   and whereby said fundamental and harmonic components of said waves allow constructing real time waveforms of voltage and current of said DUT.

8. A measurement procedure as in claim 1, whereby the impedances presented to said DUT ports at the fundamental and harmonic frequencies (Fo, 2Fo, 3Fo . . . ) are generated using electro-mechanical multi-probe harmonic tuners.

9. A measurement system as in claim 1, whereby the said measurement procedure comprises the following steps:
   a) synthesizing a reflection factor at the fundamental frequency (Fo) and a multitude N (N>1) of reflection factors Γi (1<i≤N) and presenting said reflection factors to the output port of said DUT,
   whereby said reflection factors are generated as follows:
   at the fundamental frequency (Fo) the reflection factor Γ(Fo) is generated using the passive tuner and remains fixed during the test,
   at the harmonic frequency (2Fo) the reflection factors Γi (2Fo) are generated using a combination of fixed passive and variable active injection tuning, whereby said passive tuning is selected in order to minimize the amount of injected power;

b) measuring and saving incident to and reflected power waves from said DUT.

10. A measurement system as in claim 1, whereby the measurement procedure comprises a) synthesizing a fixed reflection factor at the fundamental frequency (Fo) and a multitude (N>1) of reflection factors Fi at the harmonic frequency (2Fo) with (1<i≤N) and presenting said reflection factors to said DUT output port, and b) measuring and saving incident to and reflected power waves from said DUT, whereby said reflection factors are generated as follows:

at the fundamental frequency (Fo) the reflection factor Γ(Fo) is fixed and generated using the passive harmonic tuner, and at the harmonic frequency (2Fo) the reflection factors Fi (2Fo) are generated with the passive harmonic tuner being fixed and tuned to approximately 50Ω and the remaining tuning being generated using variable active injection tuning only.

11. A measurement system as in claim 10, whereby said reflection factors at the harmonic frequency (2Fo) are forming a circle around the center of the Smith chart with an approximately constant radius (constant VSWR circle).

\* \* \* \* \*